(12) United States Patent
Ho

(10) Patent No.: US 11,996,148 B2
(45) Date of Patent: May 28, 2024

(54) SWITCH CIRCUIT AND MEMORY ARRAY HAVING THE SAME

(71) Applicant: MACRONIX International Co., Ltd., Hsinchu (TW)

(72) Inventor: Hsin-Yi Ho, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 177 days.

(21) Appl. No.: 17/710,654

(22) Filed: Mar. 31, 2022

(65) Prior Publication Data

US 2023/0317156 A1    Oct. 5, 2023

(51) Int. Cl.
*G11C 13/00*    (2006.01)

(52) U.S. Cl.
CPC ...... *G11C 13/0059* (2013.01); *G11C 13/0004* (2013.01); *G11C 13/0026* (2013.01); *G11C 13/0028* (2013.01); *G11C 13/003* (2013.01)

(58) Field of Classification Search
CPC ............ G11C 13/0059; G11C 13/0004; G11C 13/0026; G11C 13/0028

USPC ........................................................ 365/163
See application file for complete search history.

(56) References Cited

U.S. PATENT DOCUMENTS

| | | | | |
|---|---|---|---|---|
| 2011/0051492 A1* | 3/2011 | Toda | .................... | G11C 13/004 365/189.09 |
| 2011/0157968 A1* | 6/2011 | Em | ........................ | G11C 29/02 365/194 |
| 2014/0361239 A1* | 12/2014 | Ramaswamy | ......... | H10B 63/22 257/5 |

* cited by examiner

*Primary Examiner* — Vu A Le
(74) *Attorney, Agent, or Firm* — J.C. PATENTS

(57) ABSTRACT

A memory array is provided and including a plurality of bit lines and a plurality word lines; a plurality of memory cell units, arranged at cross points of the plurality of bit lines and the plurality of word lines; a bit line switch circuit, coupled to the plurality of memory cell units and being operated to select one of the plurality of bit lines; a word line switch circuit, coupled to the plurality of memory cell units and being operated to select one of the plurality of word lines; and a voltage clamper circuit, provided in at least one of the word line switch circuit and the bit line switch circuit.

16 Claims, 9 Drawing Sheets

SWITCH CIRCUIT AND MEMORY ARRAY HAVING THE SAME

BACKGROUND

Technical Field

The invention relates to a switch circuit and memory array having the same.

Description of Related Art

The cross point (XPOINT) memory is known for resistive memory, such as phase change memory (PCM). In such a memory array 10, the memory units C are respectively arranged at the cross points of bit lines BL and word lines WL as shown in FIG. 1A. Using PCM as an example, each memory unit C may include a PCM cell and an ovonic threshold switch (OTS). When a specific memory cell (such as the circled memory unit C) is selected, the selected bit line BL is applied with a voltage VBL and the other unselected bit lines are applied with a voltage VUB; and the selected word line WL is applied with a voltage VWL and the other unselected word lines are applied with a voltage VUW. The fast-fast corner cells are usually referred to the location FF of the memory cell as shown in FIG. 1B of the memory array 10.

The cells in the fast-fast corner have short distance from the cell to the bit line switch or the word line switch. Therefore, the fast-fast corner cells may be disturbed to the reset-state (high resistance state) during the read or set operation. The causes of the disturbance of the fast-fast corner cells in the memory array 10 will be described below.

FIG. 2A illustrates a simplified diagram of the memory cell unit and the WL/BL switch for describing the fats-fat corner cell disturbance, and FIG. 2B illustrates a portion of a memory array for describing the fats-fat corner cell disturbance. As shown in FIG. 2A, the memory cell unit, including a PCM cell and an OTS, is provided between the word line WL and the bit line BL, in which the bit line BL is further coupled to a power source through a bit line switch (BL-switch) and the word line WL is further coupled to the sense amplifier SA for the read operation or a write head WH for the set or the reset operation through a word line switch (WL-switch).

For example, the bit line power domain is 7.2V~3.6V and the word line power domain is 0V~3.6V. The voltage Vt(OTS) across the OTS is for example 2V (off state), and becomes almost 0 (V(OTS-on)) when the OTS is turned on. Therefore, there is a voltage difference ($\Delta$V(OTS)=Vt(OTS)−V(OTS-on)) of 2V across the OST.

In the fast-fast corner FF, the higher bit line voltage VBL makes the OTS turn on, and then the voltage $\Delta$V(OTS) across the OTS drops from Vt(OTS) to V(OTS-on). As a result, the word line WL is coupled to higher voltage from the word line voltage VWL to voltage VWL+$\Delta$V(OTS). The PMOS transistor in the WL switch WLS1 should be turned off, but due to the word line WL1 is coupled to a higher voltage, the PMOS transistor can not be turned off. This makes the junction (indicated by the inclined arrow) in the PMOS transistor turn on or generate an off-PMOS leak (the PMOS transistor should be turned off) indicated by the vertical arrow. As a result, a higher cell current flows through the cell PCM and thus the PCM cell is melted and is reseted.

FIG. 2C illustrates a solution for addressing the disturbance issue of fast-fast corner cells according to the existent art. As shown, a PMOS transistor 20 is provided between the bit line power supply BLPS and the bit line switches (two bit line switches BLS0, BLS1 are shown). By using this configuration, the maximum current that flow to the memory cell unit is limited and the voltage on the bit line BL1 and word line WL1 can be reduced, so as to avoid the PCM cell from being melted. However, in this configuration, one bit line power supply BLPS supplies the BL voltage to plural array units. Clamping the voltage in the bit line power supply BLPS side is not effective to far-end array units.

Therefore, there are needs to develop an array configuration to provide the voltage clamping more effective to reduce the disturbance of the fast-fast corner cells.

SUMMARY

In view of the above description, according to one embodiment of the invention, a memory array is provided and comprises a plurality of bit lines and a plurality word lines; a plurality of memory cell units, arranged at cross points of the plurality of bit lines and the plurality of word lines; a bit line switch circuit, coupled to the plurality of memory cell units and being operated to select one of the plurality of bit lines; a word line switch circuit, coupled to the plurality of memory cell units and being operated to select one of the plurality of word lines; and a voltage clamper circuit, provided in at least one of the word line switch circuit and the bit line switch circuit.

In one embodiment, the word line switch circuit may further comprise plural levels of switch circuits, and the voltage clamper circuit is provided in one of the plural levels of switch circuits, which is close to the plurality of memory cell units. The voltage clamper circuit comprises a plurality of voltage clampers that are respectively inserted to the plurality word lines. In one embodiment, each of the voltage clampers is an NMOS transistor, and a gate of the NMOS transistor is applied with a clamp voltage, and the clamp voltage is a maximum value of a word line power domain.

In one embodiment, the bit line switch circuit may further comprise plural levels of switch circuits, and the voltage clamper circuit is provided in at least one of the plural levels of switch circuits. The voltage clamper circuit comprises a plurality of voltage clampers that are respectively inserted to the plurality bit lines. In one embodiment, each of the voltage clampers is an NMOS transistor, coupled to the one of the plural levels of switch circuits and has a gate of the NMOS transistor is applied with a clamp voltage to limit a current flowing from a selected bit line to a selected memory cell unit.

In one embodiment, each of the voltage clampers is a PMOS transistor, coupled in serial to the one of the plural levels of switch circuits and a gate of the PMOS transistor is applied with a clamp voltage to limit a current flowing from a selected bit line to a selected memory cell unit.

In one embodiment, each of the plurality of the memory cell units may comprise a memory cell and a selector coupled to the memory cell. The memory cell may be a phase change memory (PCM) cell and the selector may be an ovonic threshold switch (OTS). The voltage clamper circuit may be operated during a read operation and a set operation of the memory cell units.

According to one embodiment of the invention, a switch circuit for a memory array is provided and comprises a pass gate, with inputs respectively receiving a first voltage for selecting a memory cell unit of the memory array and a second voltage for unselecting the memory cell unit, and an output for outputting the first voltage or the second voltage based on a selection signal; and a voltage clamper, coupled to the pass gate and applied with a clamp voltage for clamping a voltage at a node between the pass gate and the voltage clamper or for limiting a current flowing to the memory cell unit.

In one embodiment, the switch circuit may serve as a word line switch, and the voltage clamper is an NMOS transistor, and a gate of the NMOS transistor is applied with the clamp voltage. The clamp voltage is a maximum value of a word line power domain, so that the voltage at the node between the pass gate and the voltage clamper is equal to or smaller than the maximum value.

In one embodiment, the switch circuit may serve as a bit line switch, and the voltage clamper is an NMOS transistor, a gate of the NMOS transistor is applied with the clamp voltage and is coupled to the output of the pass gate, so that the clamp voltage limits the current flowing to the memory cell unit.

In one embodiment, the switch circuit may serve as a bit line switch, and the voltage clamper is a PMOS transistor, a gate of the PMOS transistor is applied with the clamp voltage and is coupled in serial to one of the inputs of the pass gate, so that the clamp voltage limits the current flowing to the memory cell unit.

In one embodiment, the memory cell unit may comprise a memory cell and a selector coupled to the memory cell. The memory cell may be a phase change memory (PCM) cell and the selector may be an ovonic threshold switch (OTS). The voltage clamper circuit may be operated during a read operation and a set operation of the memory cell units.

According to the embodiment of the invention, by providing a voltage clamper in the word line switch circuit and or the bit line switch circuit (local switch), the cell current can be reduced during the read and the set operations, so that the disturbance of the fast-fast corner cells can be reduced.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
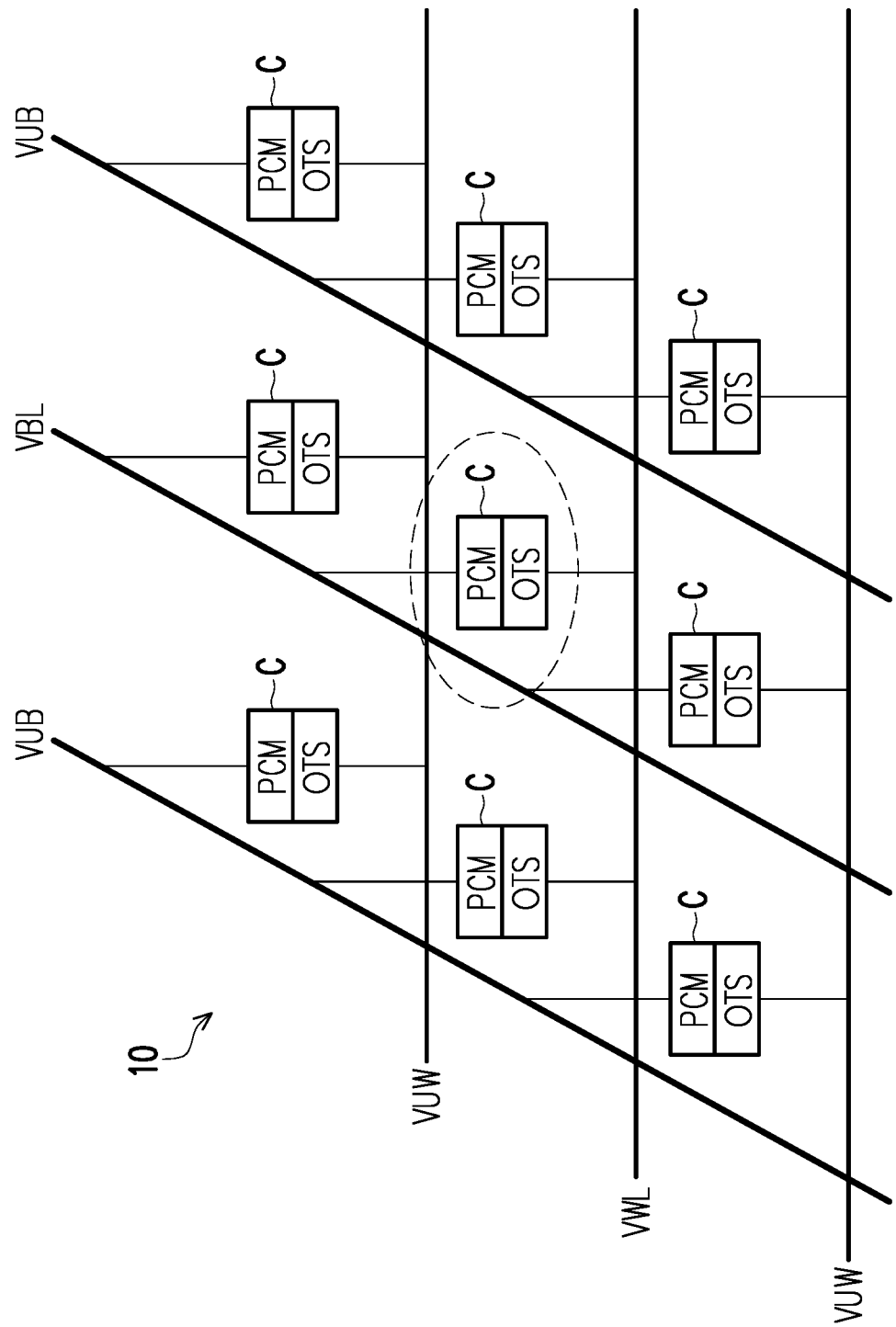
FIG. 1A illustrates the cell structure and the memory array with applied voltages.
Figure 1B:
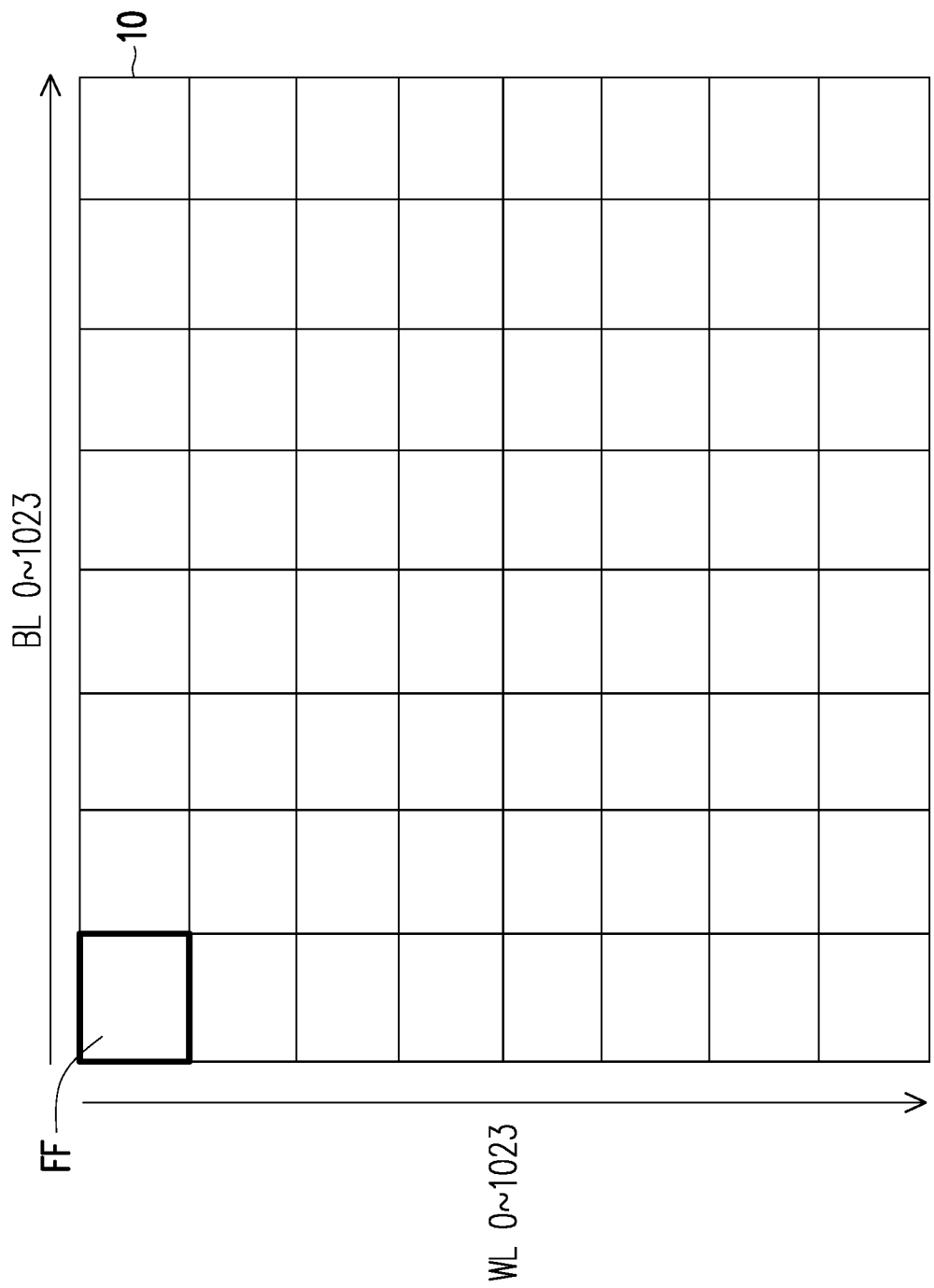
FIG. 1B illustrates the location of the fast-fast corner cells in the memory array.
Figure 2A:
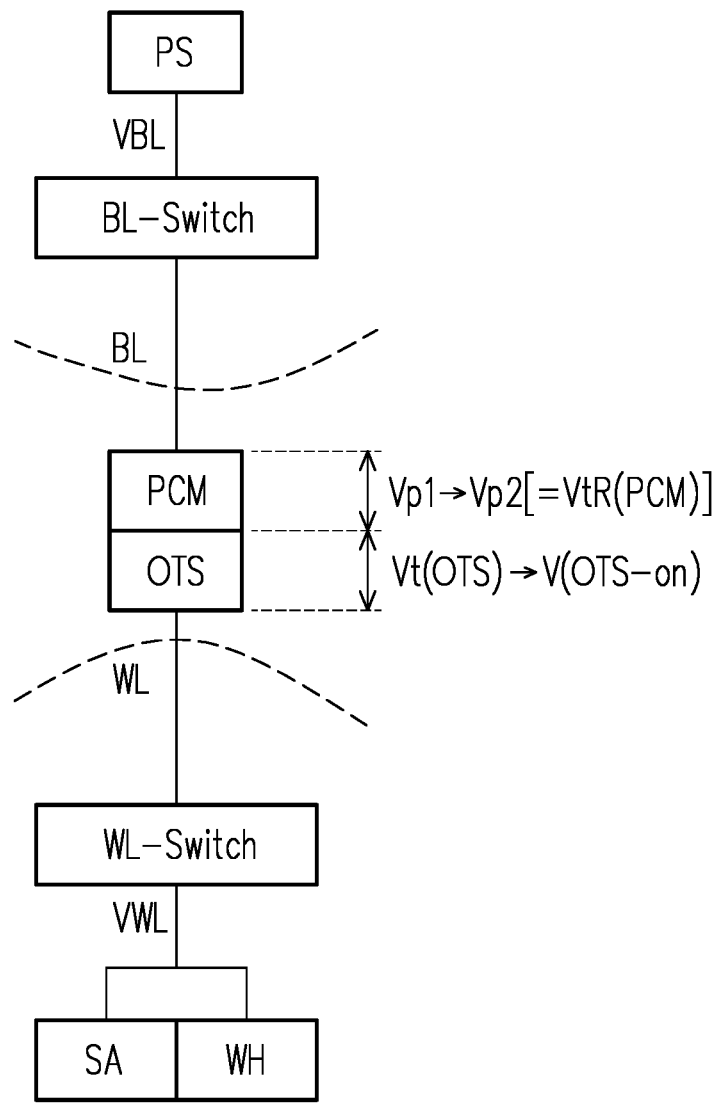
FIG. 2A illustrates a simplified diagram of the memory cell unit and the WL/BL switch for describing the fats-fat corner cell disturbance.
Figure 2B:
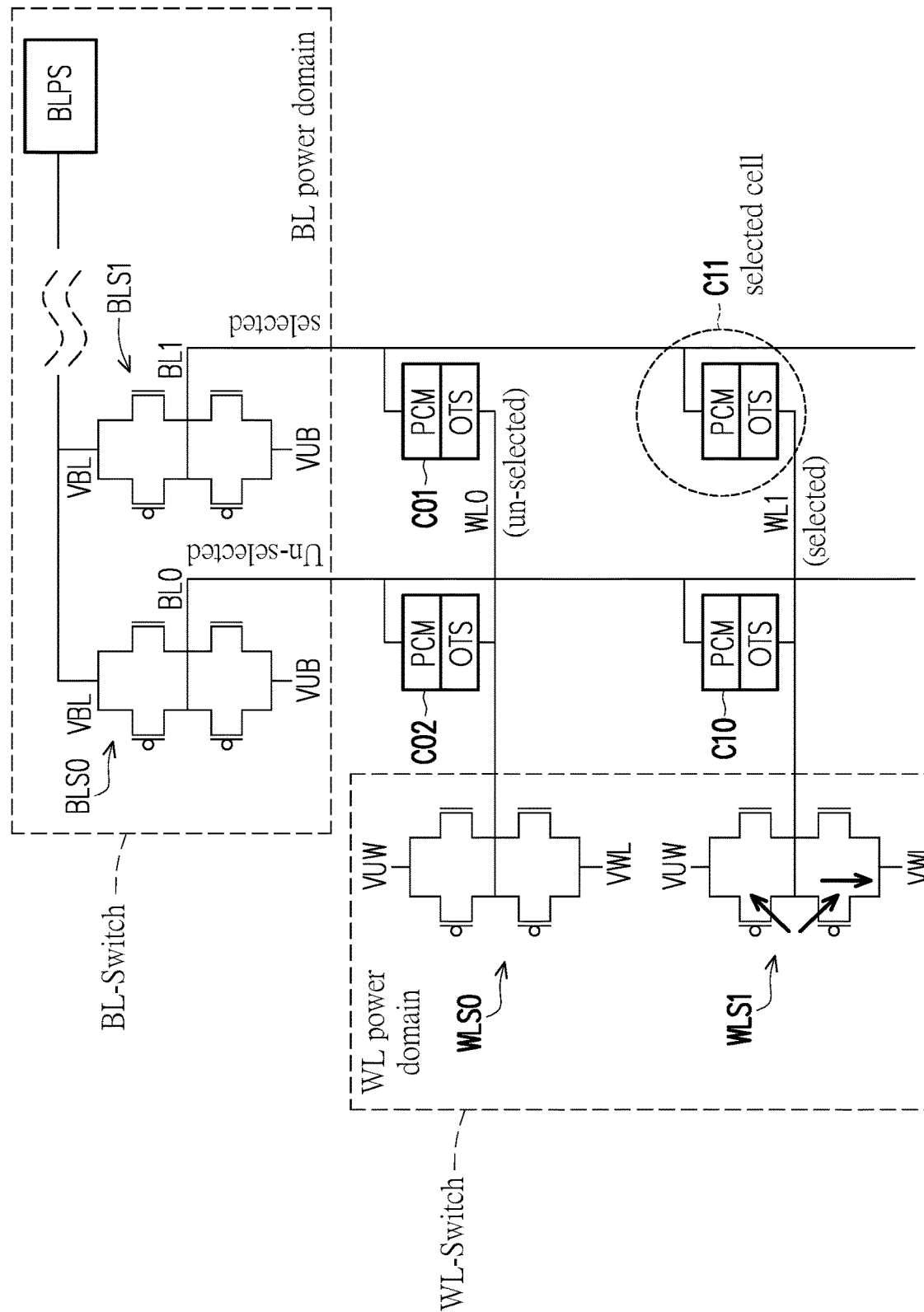
FIG. 2B illustrates a portion of a memory array for describing the fats-fat corner cell disturbance.
Figure 2C:
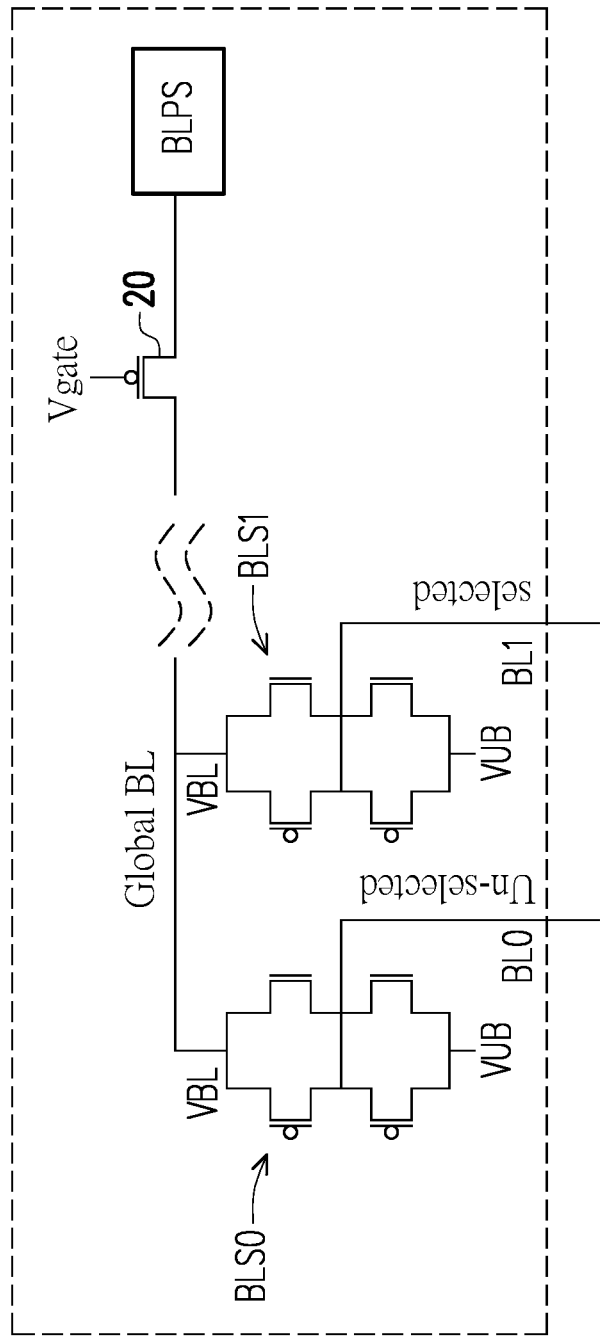
FIG. 2C illustrates a solution for addressing the disturbance issue of fast-fast corner cells according to the existent art.
Figure 3A:
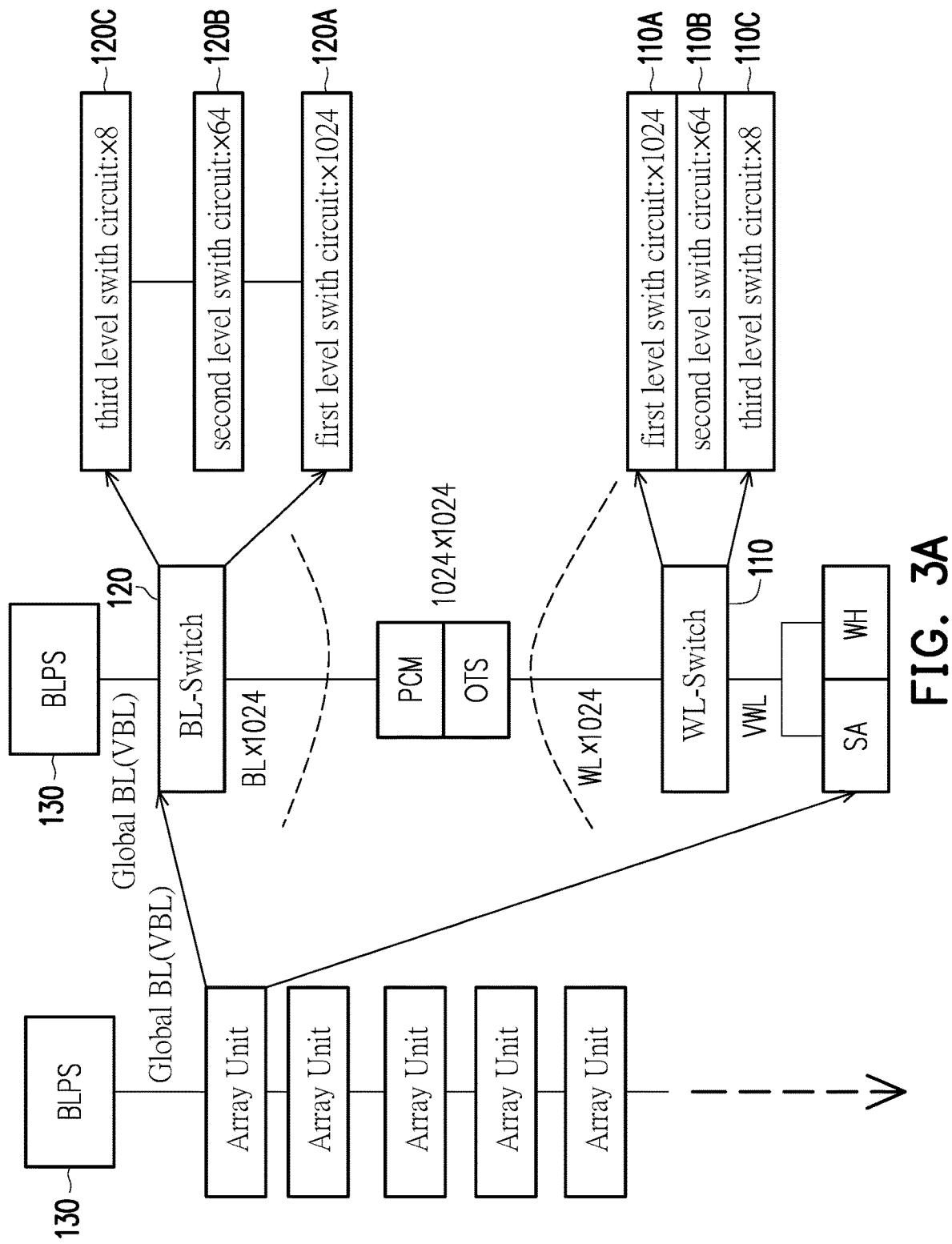
FIG. 3A illustrates a schematic memory array diagram.

FIG. 3A illustrates a schematic structure of a memory array. The memory array 100 includes a plurality of array units, and the array units are further couple to the bit line power supply (BLPS) 130 through the global bit line GBL. In this example, each array unit further includes a plurality of bit lines BL (such as 1024) and a plurality of word lines WL (such as 1024), and the memory cell units (such as 1024×1024) are respectively arranged at the cross points of the bit lines BL and word lines WL. The bit lines BL are further coupled to the global bit line GBL through the bit line switch circuit 120. The word line switch circuit 120 is further coupled to a sense amplifier SA for the read operation and a write head WH for the set and reset operations. For simplicity, one bit line BL, one word line WL and one memory cell unit are illustrated. In this example, the memory cell unit further includes a memory cell such as a PCM cell and a selector such as an OTS switch. In one embodiment, the arrangement of the PCM cell and the OTS switch can be exchanged.

The memory cell unit is coupled to the bit line switch circuit (bit line decoder) 120 through a corresponding bit line BL and coupled to the word line switch circuit (word line decoder) 110 through a corresponding word line WL. In general, the bit line switch circuit 120 and the word line switch circuit 110 have a hierarchical configuration. By the hierarchical configurations of the bit line switch circuit 120 and the word line switch circuit 110, one bit line BL and one word line WL can be selected (decoded), so that a memory cell unit can be selected. For example, in the array unit having 1024 bit lines and 1024 word lines, the bit line switch circuit 120 further includes a first level switch circuit (1024 switches), a second level switch circuit (64 switches) and a third level switch circuit (8 switches), and the word line switch circuit 110 further includes a first level switch circuit (1024 switches), a second level switch circuit (64 switches) and a third level switch circuit (8 switches). The number of switches for each level switch circuit is not particularly limited and can be modified according to actual design. In this embodiment, the first level switch circuits of the word line switch circuit 110 and the bit line switch circuit 120 are closest to the memory cell units.

Figure 3B:
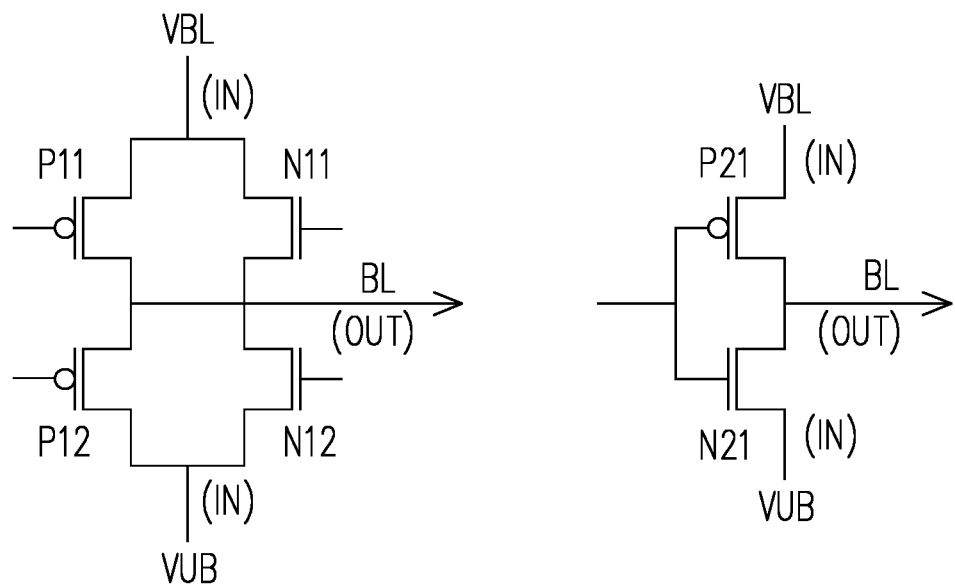
FIGS. 3B and 3C illustrate examples of the bit line switch and the word line switch.

FIG. 3B illustrates examples of the switch for each level switch circuit of the bit line switch circuit. As shown, the left example of the switch is configured by two PMOS transistors P11, P12 and two NMOS transistors N11, N12 (also referring to a bidirectional pass gate or pass gate). The gates of the PMOS transistors P11, P12 and the NMOS transistors N11, N12 are applied with a control signal (or a selection signal). The source/drain ends (as an input IN) of the PMOS transistor P11 and the NMOS transistor N11 are coupled to receive a bit line voltage VBL for selecting a bit line, and the source/drain ends (as an input IN) of the PMOS transistor P12 and the NMOS transistor N12 are coupled to receive a bit line voltage VUB for unselecting the bit line. The other source/drain ends of the PMOS transistors P11, P12 and the NMOS transistors N11, N12 are coupled to the bit line and as an output OUT. The output OUT of the switch can output the bit line voltage VBL or VUB according to the control signal or selection signal. By the operation of the hierarchical configuration of the bit line switch circuit 120, one specific bit line BL can be selected.

In addition, the right example of the switch is configured by one PMOS transistor P21 and one NMOS transistor N21 (or refer to a pass gate). One source/drain end (as an input IN) of the PMOS transistor P21 is coupled to receive a bit line voltage VBL for selecting a bit line, and one source/drain end (as an input IN) of the NMOS transistor N21 is coupled to receive a bit line voltage VUB for unselecting the bit line. The other source/drain ends of the PMOS transistor P21 and the NMOS transistor N21 are coupled to the bit line and as an output OUT. The operation of this example is similarly to the left example.

Figure 3C:
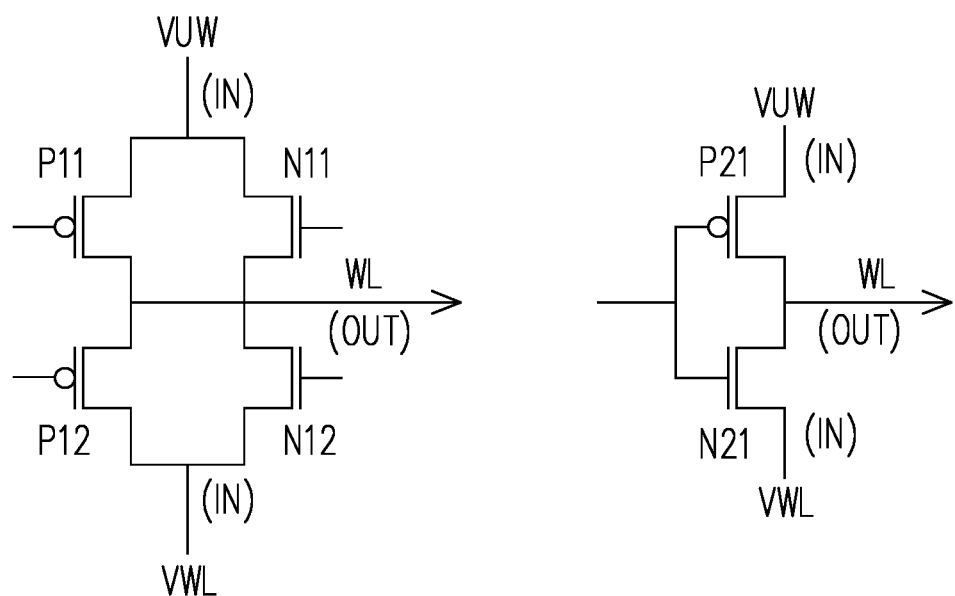

FIG. 3C illustrates examples of the switch for each level switch circuit of the word line switch circuit. Basically, the switches for each level switch circuit of the word line switch circuit 110 and the switches for each level switch circuit of the bit line switch circuit 120 are the same, and their operation method is the same.

Next, several embodiments for address the issue of disturbance of the fast-fast corner cells will be described.

Figure 4:
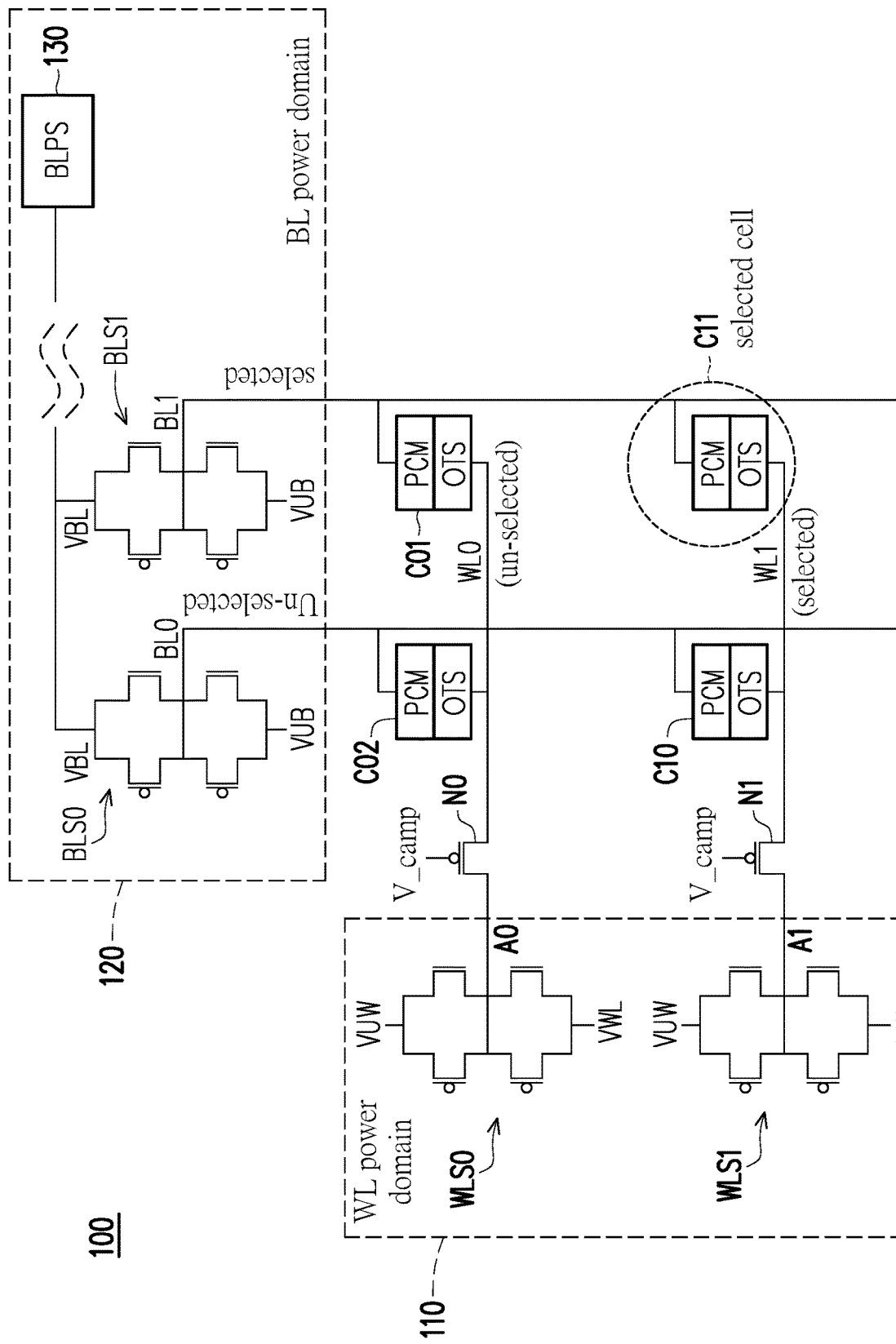
FIG. 4 illustrates a portion of a memory array according to one embodiment of the invention.

FIG. 4 illustrates a portion of a memory array according to one embodiment of the invention. In FIG. 4, a portion of the fast-fast conner cells of the memory array 100 is illustrated for simplifying descriptions, in which memory cell units C00, C01, C10, C11 provided at the cross points of the bit lines BL0~BL1 and the word lines WL0~WL1 are shown. In this example, the memory cell unit C11 at the cross point of the bit line BL1 and the word line WL 1 is selected. In addition, for simplifying description, the word line switch circuit 110 and the bit line switch circuit 120 are depicted by one level.

Referring to FIG. 4, each of the switches WLS0, WLS1 of the word line switch circuit 110 comprise a pass gate and a voltage clamper N0, N1. As an example, the pass gate can be configured with any one circuit shown in FIG. 3C or others as if it can perform the word line decoding function, and the voltage clamper N1 is provided between the memory cell units C10, C11 and the output (the node A) of the pass gate. In one example, the voltage claimer can be implemented by using a MOS transistor such as a NMOS transistor N1 (N0). Namely, the NMOS transistor N1(N0) is inserted to the WL1 (WL0) path. The gate of the NMOS transistor N1 is applied with a clamp voltage; i.e., the gate voltage Vg of the NMOS transistor N1 is V_clamp, and one of the source/drain ends of the NMOS transistor N1 is coupled to the node A and the other source/drain end is coupled to one end of each memory cell unit C10 (C11) (in this example, coupled to the OTS of the memory cell units C10, C11). Similarly, the NMOS transistor N0 is arranged in the same configuration as shown in FIG. 4.

In the embodiment, the clamp voltage V_clamp can be set to a maximum value of the word line power domain. In this example, the clamp voltage V_clamp can be set to 3.6V.

When the word line WL1 is selected, the selected word line WL1 is coupled to the word line voltage VWL through the word line switch WLS1 and the unselected word line WL0 is coupled to the word line voltage VUW through the word line switch WLS0. Similarly, the selected bit line BL1 is coupled to the bit line voltage VBL through the bit line switch BLS1 and the unselected bit line WL0 is coupled to the bit line voltage VUB through the bit line switch BLS0.

In addition, since the gate of the NMOS transistor N1 is applied with the clamp voltage V_clamp and thus is turned on, so that the voltage at the node A1 becomes "V_clamp-Vt(N1), where the threshold voltage Vt(N1) is the threshold voltage of the NMOS transistor N1. As a result, since the voltage at the node A1 is clamped to V_clamp-Vt(N1), which is smaller than the maximum value of the word line power domain.

Therefore, due to the voltage clamper (NMOS transistor N1), even thought in a case that the maximum value of the bit line power domain (such as 7.2V) is passed to the word line switch WLS1 due to the OTS is turned on, the voltage at the node A can be clamped to the voltage V_clamp-Vt (N1). As a result, the PMOS transistor in the pass gate of the word line switch WLS1 can be turned off without being affected by the disturbance of the fast-fast corner cells. Also, the junctions of the PMOS transistors will be turned off and no off-PMOS leak occurs. In addition, the cell current can be also significant reduced, so that the PCM cell will not be melted.

Figure 5:
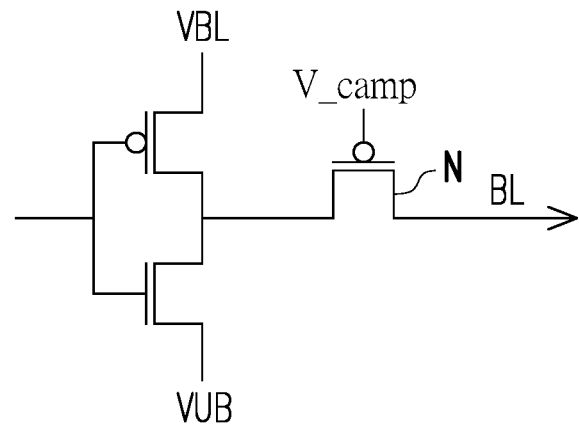
FIG. 5 illustrates a switch circuit for the bit line switch according to one embodiment of the invention.

FIG. 5 illustrates a switch circuit for the bit line switch according to one embodiment of the invention. As another embodiment of the invention, the voltage clamper can be provided in the bit line switches BLS0, BLS1 as shown in FIG. 4. In FIG. 5, a bit line switch is depicted using the pass gate having one PMOS transistor and one NMOS transistor as an example. However, this voltage clamper can be also applied to the pass gate having two PMOS transistors and two NMOS transistors as shown in FIG. 4. Referring to FIG. 5, the voltage clamper N can be an NMOS transistor and is coupled to the output of the pass gate (or referring to the connection node of the two transistors).

Figure 6:
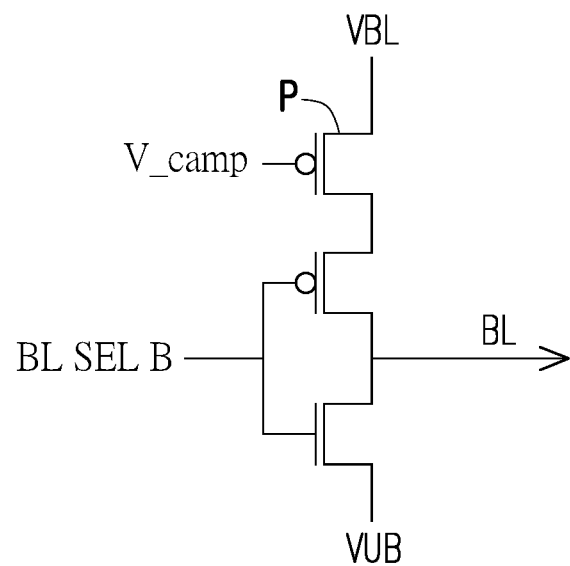
FIG. 6 illustrates another switch circuit for the bit line switch according to one embodiment of the invention.

FIG. 6 illustrates another switch circuit for the bit line switch according to one embodiment of the invention. Similarly, a bit line switch is depicted using the pass gate having one PMOS transistor and one NMOS transistor as an example. However, this voltage clamper can be also applied to the pass gate having two PMOS transistors and two NMOS transistors as shown in FIG. 4. Referring to FIG. 6, the voltage clamper P can be a PMOS transistor and is coupled in serial to one of the inputs of the pass gate (receiving the bit line voltage VBL or VUB).

By using the bit line switch shown in FIG. 5 or FIG. 6, the clamp voltage V_clamp can be set to the maximum value of the bit line power domain (for example, 3.6V~7.2V). In the read or the set operation to the memory cell unit, due to the clamp voltage V_clamp, the current flowing from the selected bit line BL to the selected memory cell unit can be limited and reduced, so that the cell current will not too high and thus the PCM cell will not be melted.

As described above, the disclosure provides a switch circuit for a memory array, and is applicable for each level of switch circuit of the word line switch circuit 110 and the bit line switch circuit 120. The switch comprises a pass gate as shown in FIG. 3B and FIG. 3C, with inputs IN respectively receiving a first voltage (such as bit line voltage VBL or word line voltage VWL) for selecting a memory cell unit C of the memory array 10 and a second voltage (such as bit line voltage VUB or word line voltage VUW) for unselecting the memory cell unit C, and an output OUT for outputting the first voltage (VBL or VWL) or the second voltage (VUB or VUW) based on a selection signal. The switch further comprises a voltage clamper (such as a PMOS or an NMOS transistor), coupled to the pass gate and applied with a clamp voltage for clamping a voltage at a node between the pass gate and the voltage clamper or for limiting a current flowing to the memory cell unit C.

According to the embodiment, when the voltage clamper is provided in the word line switch circuit 110, the voltage clamper is provided to each switch of the first level switch circuit of the word line switch circuit 110. The first level switch circuit is closet to the memory cell unit (the OTS), and once the OTS is turned, the high voltage from the bit line has to be clamped at the first level switch circuit.

In addition, when the voltage clamper is provided in the bit line switch circuit 120, the voltage clamper can be provided in each switch of at least one of the first, the second and the third level switch circuit of the bit line switch circuit 120. No matter the voltage clamper is provided the first, the second or the third level switch circuit of the bit line switch circuit 120, the cell current can be effectively reduced and the PCM cell will not be melted so that the disturbance of fast-fast corner cells can be avoided.

In addition, the voltage clamper can be provided in the word line switch circuit 110 or the bit line switch circuit 120, or can be also provided in both the word line switch circuit 110 and the bit line switch circuit 120.

In general, the voltage clamper is operated in the read or the set operation. However, if the Voltage clamping can be operated for read and set. Furthermore, the disclosed configuration may be applied to any kind of memory in a case that the maximum voltage across memory cell in off-state is higher than on-state. In addition, the disclosed configuration may be applied to any kind of memory with two sides of operation voltage ranges, in which the coupling voltage from one side (BL) to the other side (WL) will make junction of the transistor in the switch circuit turn on or off-PMOS/off-NMOS turn on.

According to the embodiment of the invention, by providing a voltage clamper in the word line switch circuit (local switch), the voltage at the node near the memory cell unit can be clamped to a voltage smaller than the maximum value of the word line power domain, and thus the cell current can be reduced so that the disturbance of the fast-fast corner cells can be reduced.

In addition, by providing a voltage clamper in the bit line switch circuit (local switch), the current from the bit line to the memory cell unit can be limited so that the cell current can be reduced and the disturbance of the fast-fast corner cells can be reduced.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory array, comprising:
    a plurality of bit lines and a plurality word lines;
    a plurality of memory cell units, arranged at cross points of the plurality of bit lines and the plurality of word lines;
    a bit line switch circuit, coupled to the plurality of memory cell units and being operated to select one of the plurality of bit lines;
    a word line switch circuit, coupled to the plurality of memory cell units and being operated to select one of the plurality of word lines; and
    a voltage damper circuit, applied with a clamp voltage and provided in at least one of the word line switch circuit and the bit line switch circuit,
    wherein in a case that the voltage damper circuit is provided in the word line switch circuit, a selected word line is provided with the clamp voltage, and
    in a case that the voltage damper circuit is provided in the bit line switch circuit, a selected bit line is provided with the clamp voltage.

2. The memory array of claim 1, wherein
    the word line switch circuit further comprises plural levels of switch circuits, and
    the voltage damper circuit is provided in one of the plural levels of switch circuits, which is close to the plurality of memory cell units,
    the voltage damper circuit comprises a plurality of voltage dampers that are respectively inserted to the plurality word lines.

3. The memory array of claim 2, wherein
    each of the voltage dampers is an NMOS transistor, and a gate of the NMOS transistor is applied with a clamp voltage, and
    the clamp voltage is a maximum value of a word line power domain.

4. The memory array of claim 1, wherein
    the bit line switch circuit further comprises plural levels of switch circuits, and
    the voltage damper circuit is provided in at least one of the plural levels of switch circuits, and
    the voltage damper circuit comprises a plurality of voltage dampers that are respectively inserted to the plurality bit lines.

5. The memory array of claim 4, wherein
    each of the voltage dampers is an NMOS transistor, coupled to the one of the plural levels of switch circuits and has a gate of the NMOS transistor is applied with a clamp voltage to limit a current flowing from a selected bit line to a selected memory cell unit.

6. The memory array of claim 4, wherein
    each of the voltage dampers is a PMOS transistor, coupled in serial to the one of the plural levels of switch circuits and a gate of the PMOS transistor is applied with a clamp voltage to limit a current flowing from a selected bit line to a selected memory cell unit.

7. The memory array of claim 1, wherein
    each of the plurality of the memory cell units comprises a memory cell and a selector coupled to the memory cell.

8. The memory array of claim 7, wherein the memory cell is a phase change memory (PCM) cell and the selector is an ovonic threshold switch (OTS).

9. The memory array of claim 8, wherein
    the voltage damper circuit is operated during a read operation and a set operation of the memory cell units.

10. A switch circuit for a memory array, comprising:
    a pass gate, with inputs respectively receiving a first voltage for selecting a memory cell unit of the memory array and a second voltage for unselecting the memory cell unit, and an output for outputting the first voltage or the second voltage based on a selection signal; and
    a voltage damper, coupled to the pass gate and applied with a clamp voltage for clamping a voltage at a node between the pass gate and the voltage damper or for limiting a current flowing to the memory cell unit.

11. The switch circuit for a memory array according to claim 10, wherein
    the switch circuit serves as a word line switch, and
    the voltage damper is an NMOS transistor, and a gate of the NMOS transistor is applied with the clamp voltage, and
    the clamp voltage is a maximum value of a word line power domain, so that the voltage at the node between the pass gate and the voltage damper is equal to or smaller than the maximum value.

12. The switch circuit for a memory array according to claim 10, wherein
    the switch circuit serves as a bit line switch, and
    the voltage damper is an NMOS transistor, a gate of the NMOS transistor is applied with the clamp voltage and is coupled to the output of the pass gate, so that the clamp voltage limits the current flowing to the memory cell unit.

13. The switch circuit for a memory array according to claim 10, wherein the switch circuit serves as a bit line switch, and the voltage damper is a PMOS transistor, a gate of the PMOS transistor is applied with the clamp voltage and is coupled in serial to one of the inputs of the pass gate, so that the clamp voltage limits the current flowing to the memory cell unit.

14. The switch circuit for a memory array according to claim 10, wherein the memory cell unit comprises a memory cell and a selector coupled to the memory cell.

15. The switch circuit for a memory array according to claim 14, wherein the memory cell is a phase change memory (PCM) cell and the selector is an ovonic threshold switch (OTS).

16. The switch circuit for a memory array according to claim 14, wherein the voltage damper circuit is operated during a read operation and a set operation of the memory cell units.

\* \* \* \* \*